United States Patent
Zeng

(10) Patent No.: US 11,081,462 B2
(45) Date of Patent: Aug. 3, 2021

(54) METHOD FOR MANUFACTURING A BONDING STRUCTURE

(71) Applicant: Wuhan Xinxin Semiconductor Manufacturing Co., Ltd., Hubei (CN)

(72) Inventor: Tian Zeng, Hubei (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 0 days.

(21) Appl. No.: 16/582,340

(22) Filed: Sep. 25, 2019

(65) Prior Publication Data

US 2020/0402945 A1 Dec. 24, 2020

(30) Foreign Application Priority Data

Jun. 19, 2019 (CN) .......................... 201910532042.2

(51) Int. Cl.
*H01L 23/48* (2006.01)
*H01L 23/00* (2006.01)

(52) U.S. Cl.
CPC .............. *H01L 24/32* (2013.01); *H01L 24/27* (2013.01); *H01L 2924/3512* (2013.01)

(58) Field of Classification Search
CPC .. H01L 24/32; H01L 24/27; H01L 2924/3512
See application file for complete search history.

(56) References Cited

U.S. PATENT DOCUMENTS

| | | |
|---|---|---|
| 8,173,518 B2 | 5/2012 | Liu et al. |
| 8,314,007 B2 | 11/2012 | Vaufredaz |
| 2010/0248414 A1 | 9/2010 | Liu et al. |
| 2011/0097874 A1 | 4/2011 | Broekaart et al. |
| 2011/0151644 A1 | 6/2011 | Vaufredaz |

(Continued)

FOREIGN PATENT DOCUMENTS

| | | |
|---|---|---|
| CN | 101853864 A | 10/2010 |
| CN | 102110591 A | 6/2011 |

(Continued)

OTHER PUBLICATIONS

First Chinese Office Action regarding Application No. 201910532042.2 dated Jun. 3, 2020. English translation provided by Unitalen Attorneys at Law.

*Primary Examiner* — Phuc T Dang
(74) *Attorney, Agent, or Firm* — Harness, Dickey & Pierce, P.L.C.

(57) ABSTRACT

A bonding structure and a method for manufacturing the same. First edge trimming is performed from the bonding surface of an n-th wafer in bonding the n-th wafer and an (n−1)th wafer, and a width of the first edge trimming is $W_n$. As n increases, the width of the first edge trimming is gradually increased. In the trimming, a portion that is not even at the edge of the n-th wafer can be removed. The bonding surface of the n-th wafer faces the bonding surface of the (n−1)-th wafer, so as to bond the n-th wafer and the (n−1)-th wafer. Afterwards the substrate of the n-th wafer is thinned, so as to form the (n−1)-th wafer stack. There is a reduced possibility that a gap exists between the bonding interfaces of the wafers, a bonding strength between the wafers is improved, and a risk of cracking is reduced.

6 Claims, 9 Drawing Sheets

(56) References Cited

U.S. PATENT DOCUMENTS

| | | | |
|---|---|---|---|
| 2013/0328174 A1* | 12/2013 | La Tulipe, Jr. | H01L 25/50 257/629 |
| 2019/0088550 A1* | 3/2019 | Ganitzer | H01L 23/481 |
| 2019/0287788 A1* | 9/2019 | Lin | H01L 21/2007 |

FOREIGN PATENT DOCUMENTS

| | | |
|---|---|---|
| CN | 104658927 A | 5/2015 |
| CN | 105271108 A | 1/2016 |

\* cited by examiner

METHOD FOR MANUFACTURING A BONDING STRUCTURE

The present disclosure claims the priority to Chinese Patent Application No. 201910532042.2, titled "BONDING STRUCTURE AND METHOD FOR MANUFACTURING THE SAME", filed on Jun. 19, 2019 with China National Intellectual Property Administration, the content of which is incorporated herein by reference.

FIELD

The present disclosure relates to the field of semiconductor devices and manufacture thereof, and particularly, to a bonding structure and a method for manufacturing the bonding structure.

BACKGROUND

3D-IC (three-dimensional integrated circuit) technology has been widely used with continuous development of semiconductor technology. The 3D-IC technology bonds wafers with different functions together by using wafer-level packaging techniques. The 3D-IC technology has advantages of high performance, low cost and high integration.

In implementation of wafer-level packaging technology, it is necessary to ensure that bonding interfaces of wafers are completely adhered with each other without a gap during the bonding process. Otherwise, a bonding strength between the wafers is reduced, resulting in a risk of cracking during a thinning process or another process that follows.

SUMMARY

A bonding structure and a method for manufacturing the bonding structure are provided according to embodiments of the present disclosure. There is a reduced possibility that a gap exists between bonding interfaces of wafers, and a bonding strength between the wafers is improved.

Following technical solutions are provided according to embodiments of the present disclosure, in order to achieve the above objectives.

A method for manufacturing a bonding structure is provided according to an embodiment of the present disclosure, including bonding N wafers sequentially. For each integer n ranging from 2 to N, bonding an n-th wafer and an (n−1)-th wafer includes: performing first edge trimming from a bonding surface of the n-th wafer, where a width of the first edge trimming is $W_n$, and the first edge trimming extends into a substrate of the n-th wafer in depth; bonding the n-th wafer and the (n−1)-th wafer, where the bonding surface of the n-th wafer faces the (n−1)-th wafer; and thinning the substrate of the n-th wafer, to form an (n−1)-th wafer stack. N is a natural number greater than 1. $W_n$ is greater than $W_{n-1}$ when n≥3.

Optionally, a quantity of types of bonding between adjacent ones among the N wafers is more than one.

Optionally, a quantity of a type of bonding between adjacent ones among the N wafers is one.

Optionally, the type of bonding includes: bonding with a bonding layer of a single material, or hybrid bonding.

Optionally, thinning the substrate of the n-th wafer includes: performing first thinning by using chemical mechanical polishing, and performing second thinning by using chemical etching after the first thinning.

Optionally, after thinning the substrate of the n-th wafer, bonding the n-th wafer and the (n−1)-th wafer further includes: performing second edge trimming on the (n−1)-th wafer stack, where a width of the second edge trimming is $D_{n-1}$, and the second edge trimming extends into the substrate of a 1st wafer in depth. $D_{n-1}$ is greater than $W_n$ and smaller than $W_{n+1}$ when 2≤n<N.

A bonding structure is provided according to an embodiment of the present disclosure, including: a wafer stack formed by bonding N wafers sequentially, where there is a notch at an edge of the wafer stack, and the notch extends from a surface of a wafer at an end of the wafer stack into a substrate of another wafer at another end of the wafer stack.

Optionally, a quantity of types of bonding between adjacent ones among the N wafers is more than one.

Optionally, a quantity of a type of bonding between adjacent ones among the N wafers is one.

Optionally, the type of bonding includes: bonding with a bonding layer of a single material, or hybrid bonding.

In the bonding structure and the method for manufacturing the bonding structure according to the embodiment of the present disclosure, the first edge trimming can be performed from the bonding surface of the n-th wafer in bonding the n-th wafer and the (n−1)th wafer, and the width of the first edge trimming is $W_n$. As n increases, the width of the first edge trimming can be gradually increased. A reason is that an edge of a wafer is generally not even enough, resulting in a gap in bonding the wafers. After trimming the edge of the wafer, a portion that is not even at the edge of the n-th wafer can be removed. The bonding surface of the n-th wafer faces the bonding surface of the (n−1)-th wafer, so as to bond the n-th wafer and the (n−1)-th wafer. There is a reduced possibility that a gap exists between the bonding interfaces of the wafers, and a bonding strength between the wafers is improved. Afterwards the substrate of the n-th wafer is thinned, so as to form the (n−1)-th wafer stack. Since the bonding between adjacent wafers is strong, the formed wafer stack has a high reliability and a low risk of cracking.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are some embodiments of the present disclosure, and other drawings may be obtained by those skilled in the art based on the provided drawings without creative efforts.

DETAILED DESCRIPTION

For better understanding of the above objects, features and advantages of the present disclosure, hereinafter specific embodiments of the present disclosure are described in detail in conjunction with the drawings.

Many specific details are illustrated in following description to facilitate a full understanding of the present disclosure. The present disclosure may be practiced in another manner besides those described herein. Those skilled in the art can analogize without departing from the scope of the present disclosure. Therefore, the present disclosure is not limited to specific embodiments disclosed hereinafter.

The present disclosure is described in detail in conjunction with the drawings. To facilitate description in describing embodiments of the present disclosure in detail, a sectional view showing a structure of a device is not partially enlarged on a general scale. The schematic diagram is merely exemplary, and the protection scope of present disclosure should not be limited thereto. In addition, the three-dimensional spatial dimensions of length, width and depth should be included in practical manufacture.

In implementation of wafer-level packaging technology, it is necessary to ensure that bonding interfaces of wafers are completely adhered with each other without a gap during the bonding process. Otherwise, a bonding strength between the wafers is reduced, resulting in a risk of cracking during a thinning process or another process that follows.

Figure 1:
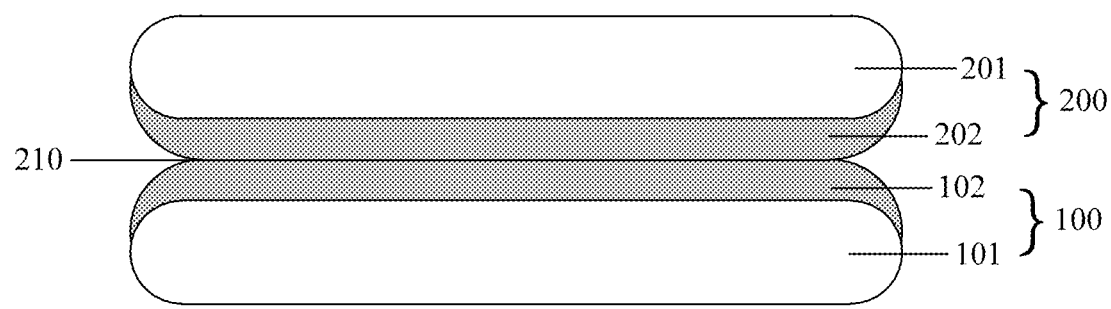
FIG. 1 shows a schematic diagram of a wafer stack in conventional technology.

Generally, an edge of a wafer is not even. Reference is made to FIG. 1, which is a schematic diagram of a wafer stack. The wafer stack includes a 1st wafer 100 and a 2nd wafer 200. The 1st wafer 100 includes a substrate 101, and a device structure 102 on the substrate 101. A surface provided with the device structure 102 of the 1st wafer 100 serves as a front surface of the 1st wafer 100, and a surface opposite to the front surface of the wafer 100 serves as a back surface of the 1st wafer 100. The 2nd wafer 200 is similar to the 1st wafer 100 in structure, and may include a substrate 201 and a device structure 202 that is on the substrate 201. A surface provided with the device structure 202 of the 2nd wafer 200 serves as a front surface of the 2nd wafer 200, and a surface opposite to the front surface of the wafer 200 serves as a back surface of the 2nd wafer 200.

The front surface of the 1st wafer 100 and the front surface of the 2nd wafer 200 may be bonded together face-to-face, to form a bonding surface 210. Both edges of the front surfaces of the 1st wafer 100 and the 2nd wafer 200 are not even, but have a curved surface of a certain radian. In a specific application, the edges of the 1st wafer 100 and the 2nd wafer 200 may have other shapes, for example, having a concave or convex structure. Since the edges of the 1st wafer and the 2nd wafer are not even, there is a gap at an edge of the bonding surface 210. The bonding surface is apt to crack, lowering a bonding strength between the wafers.

In view of the above, a bonding structure and a method for manufacturing the bonding structure are provided according to an embodiment of the present disclosure. First edge trimming can be performed from a bonding surface of an n-th wafer in bonding the n-th wafer and an (n−1)th wafer, and a width of the first edge trimming is $W_n$. As n increases, the width of the first edge trimming can be gradually increased. A reason is that an edge of a wafer is generally not even enough, resulting in a gap in bonding the wafers. After trimming the edge of the wafer, a portion that is not even at the edge of the n-th wafer can be removed. The bonding surface of the n-th wafer faces a bonding surface of the (n−1)-th wafer, so as to bond the n-th wafer and the (n−1)-th wafer. There is a reduced possibility that a gap exists between the bonding interfaces of the wafers, and a bonding strength between the wafers is improved. Afterwards a substrate of the n-th wafer is thinned, so as to form an (n−1)-th wafer stack. Since the bonding between adjacent wafers is strong, the formed wafer stack has a high reliability and a low risk of cracking.

For better understanding the technical solutions and technical effects of the present disclosure, hereinafter an embodiment is described in detail below in conjunction with a flowchart in FIG. 2, and FIGS. 3 to 9.

In a method for manufacturing a bonding structure according to an embodiment of the present disclosure, N wafers may be sequentially bonded together to form an (N−1)-th wafer stack. A step of bonding an n-th wafer and an (n−1)-th wafer (n is an integer ranging from 2 to N) may refer to following description. By repeating the step of bonding the n-th wafer and the (n−1)-th wafer, N wafers can be sequentially bonded together. It can be appreciated that herein N is a natural number greater than 1, that is, N is at least 2. Two or more wafers can be bonded according to the method herein, and a total quantity of times of bonding is (N−1). n ranges from 2 to N.

For example, in a case that n is 2, the 1st wafer and the 2nd wafer can be bonded according to the step of bonding, to form a 1st wafer stack. Then, in a case that n is 3, the 2nd wafer can be bonded to the 3rd wafer according to the step of bonding, namely, the 3rd wafer is bonded on the 1st wafer stack, to form a 2nd wafer stack. Other cases can be obtained by analogy.

Figure 2:
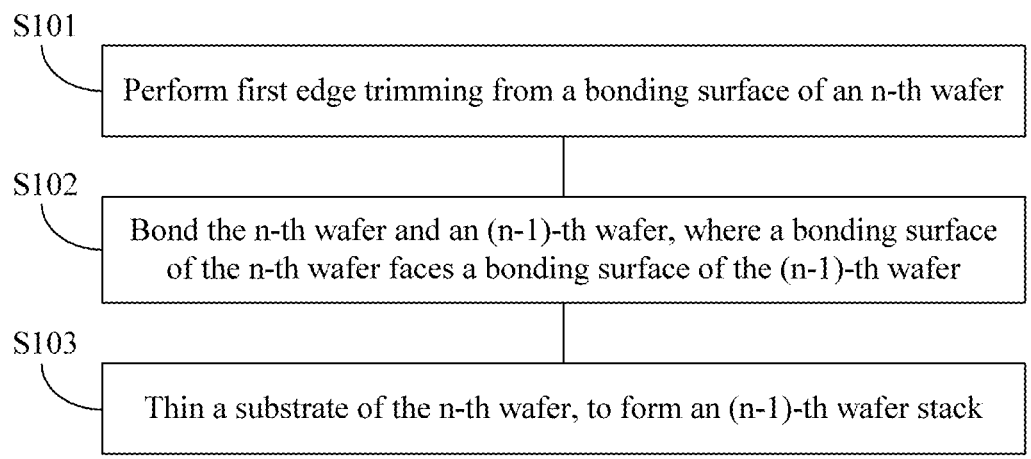
FIG. 2 is a schematic flow chart of a method for bonding an n-th wafer and an (n−1)th wafer in a bonding structure according to an embodiment of the present disclosure.

Reference is made to FIG. 2, which is a schematic flowchart of a method for bonding an n-th wafer and an (n−1)-th wafer in a bonding structure according to an embodiment of the present disclosure. The method includes steps S101 to S103.

Figure 3:
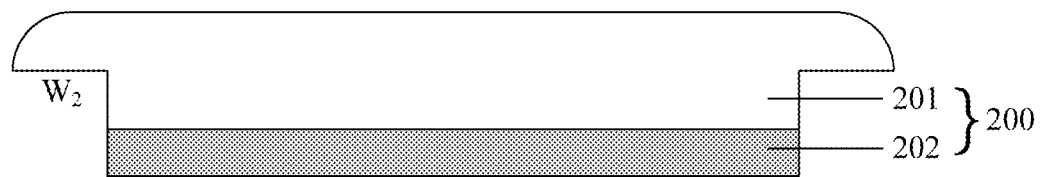
FIGS. 3 to 9 are schematic diagrams of wafers in a process of bonding the n-th wafer and the (n−1)-th wafer in a bonding structure according to an embodiment of the present disclosure.
Figure 4:
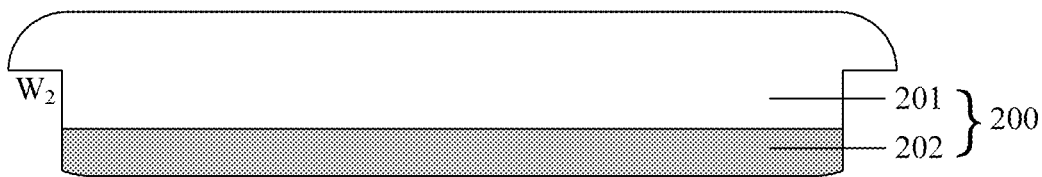

In S101, first edge trimming is performed from a bonding surface of an n-th wafer, as shown in FIG. 3 and FIG. 4.

In one embodiment, all processes prior to bonding have been performed on each wafer for bonding, and a necessary device structure and an interconnection layer for electrically connecting the device structure have been formed on each wafer. The device structure may be covered by a dielectric layer. The dielectric layer may be a stacked structure, including an interlayer dielectric layer, an inter-metal dielectric layer, a bonding layer, and the like. The interconnection layer may be formed in the dielectric layer.

The device structure may be a MOS device, a memory device, and/or other passive devices. The memory device may include a non-volatile memory, a random memory, or the like. The non-volatile memory may include, for example, a floating gate FET such as a NOR flash memory or a NAND flash memory, a ferroelectric memory, or a phase change memory. The device structure may be a planar device or a stereo device. The stereo device may be, for example, a fin-FET (fin field effect transistor), a three-dimensional memory, or the like. The interconnection layer includes a contact plug, a through-hole, a metal layer, or the like. The interconnection layer may include one or more layers. The interconnection layer may be made of metal such as tungsten, aluminum, copper, or the like.

In one embodiment, the device structures may be different on the different wafers, For example, the device structures may be of different types of devices, or of a same type of devices and with different operating voltages. The device structures on a same wafer may be same or different.

The first edge trimming may be performed from the bonding surface of the n-th wafer, before bonding the n-th wafer and the (n−1)-th wafer. A width of the first edge trimming may be $W_n$, and the first edge trimming extends into a substrate of the n-th wafer in depth. In one embodiment, $W_n$ may gradually increase as n increases. Namely, $W_n$ is greater than $W_{n-1}$ in case of n≥3. For example, the width $W_3$ of the first edge trimming on the 3rd wafer 300 is greater than the width $W_2$ of the first edge trimming on the 2nd wafer 200, and the width $W_4$ of the first edge trimming on the 4th wafer 400 is greater than the width $W_3$ of the first edge trimming on the 3rd wafer 300.

For example, n=2, namely, the process of bonding are between the 1st wafer and the 2nd wafer. The 1st wafer may be the first wafer 100, including the substrate 101 and the device structure 102 on the substrate 101. The front surface of the 1st wafer 100 may serve as a bonding surface. The 2nd wafer may be the second wafer 200, including the substrate 201 and the device structure 202 on the substrate 201. The front surface of the 2nd wafer 200 may serve as a bonding surface.

Before bonding the 2nd wafer 200 and the 1st wafer 100, first edge trimming may be performed from the bonding surface of the 2nd wafer 200. The first edge trimming may extend into the substrate 201 of the 2nd wafer 200 in depth. A width of the first edge trimming is $W_2$. $W_2$ may be larger than a size of a curved portion at the edge of the 2nd wafer 200. Referring to FIG. 3, an uneven portion of the 2nd wafer 200 is removed after performing the first edge trimming on the 2nd wafer 200. The gap at the bonding surface is less probable in a wafer stack that is subsequently formed. In a case that $W_2$ is smaller than the size of the curved portion at the edge of the 2nd wafer 200, as shown in FIG. 4, the uneven portion of the 2nd wafer 200 is not completely removed. Hence, there is a gap at an edge of a bonding surface 210 that is formed after bonding the 1st wafer 100 and the 2nd wafer 200, and the bond structure 210 is apt to crack in a subsequent process.

Figure 5:
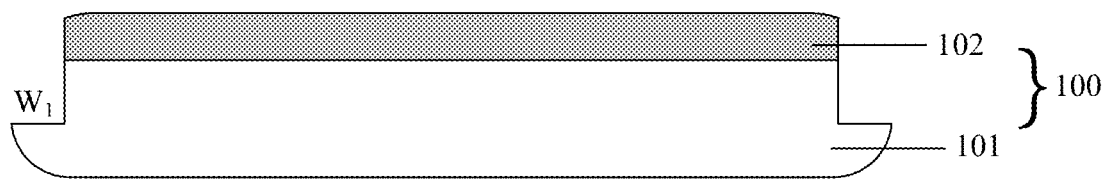

In embodiments of the present disclosure, the 1st wafer 100 serves as a bottommost wafer of the entire bonding structure, and other wafers are sequentially bonded above the 1st wafer. In some embodiments as referring to FIG. 5, edge trimming may be performed from a bonding surface of the 1st wafer 100. A width $W_1$ of the edge trimming may be arbitrary. For example, the width $W_1$ may be smaller than a size of a curved portion at the edge of the 1st wafer 100, as shown in FIG. 5. Or, the width $W_1$ may be larger than the size of the curved portion of the edge of the 1st wafer 100, so as to improve a bonding strength between the 1st wafer 100 and the 2nd wafer 200.

Figure 7:
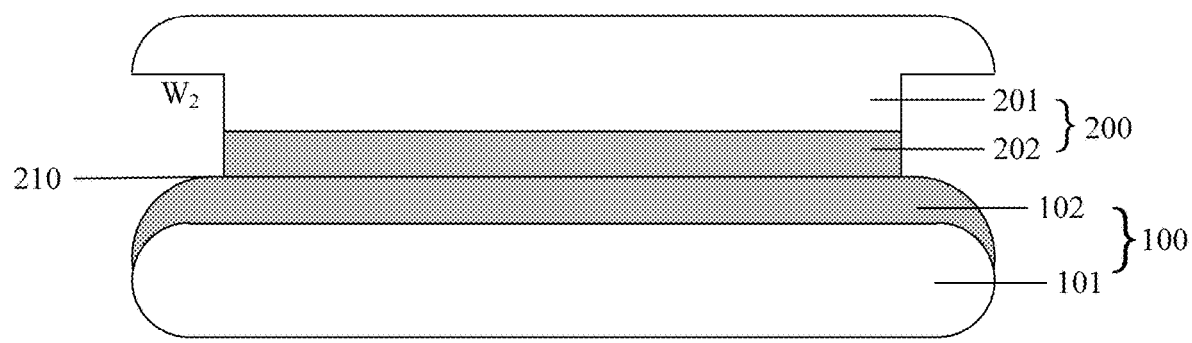

In another embodiment, the edge trimming may not be performed on the 1st wafer 100. Referring to FIG. 7, the 2nd wafer may be bonded to the 1st wafer 100 after the edge trimming is performed on 2nd wafer. In order to secure the bonding strength and the bonding quality, the width $W_2$ of the edge trimming on the 2nd wafer 200 may be larger than a size of the curved portion at the edge of the 1st wafer 100.

Figure 6:
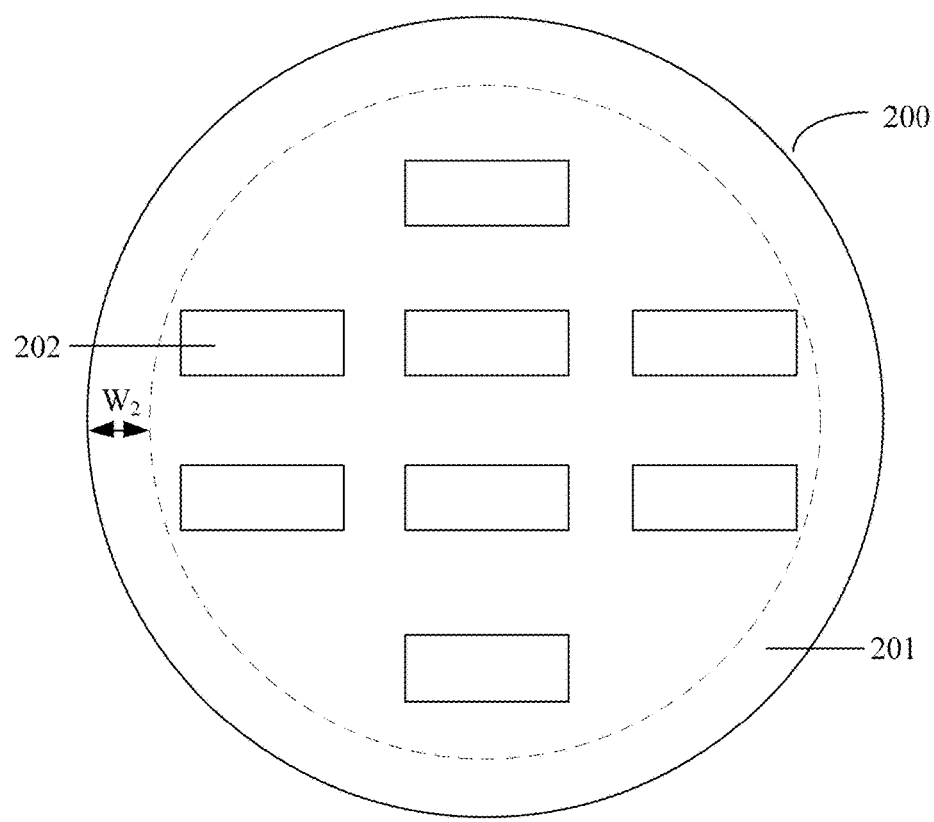

A manner of the first edge trimming for the n-th wafer may be determined according to a practical situation. Taking the first edge trimming on the 2nd wafer 200 as an example, the first edge trimming may be performed along the dash line as shown in FIG. 6, thereby removing the uneven portion at the edge of the 2nd wafer 200. The dash line may be a circular curve, which has a same distance to a periphery of the wafer in different regions. The width of the edge trimming is a distance from a trimming rim in the different regions of the wafer to the periphery of the wafer. In this embodiment, the rim of the edge trimming may be alternatively performed along a straight line. In such case, a cutting line parallel to the trimming rim may be made at a near portion of the periphery of the wafer, and the width of the edge trimming may be a distance between the trimming rim and the cutting line.

In S102, the n-th wafer and the (n−1)-th wafer are bonded, where the bonding surface of the n-th wafer faces the (n−1)-th wafer, as shown in FIG. 7.

A material layer for bonding may be formed on the bonding surface of the n-th wafer. The bonding material layer may be an adhesive layer of a dielectric material, such as silicon oxide or silicon nitride, according to different designs and different bonding manners. Thereby, the two wafers are bonded by a molecular force provided by the adhesive layer. The bonding may also be performed by means of hybrid bonding. The adhesive layer of the dielectric material and a metal bonding marking are formed on the front surfaces of both two wafers, and the hybrid bonding between the two wafers is implemented after aligning the bonding markings.

It can be understood that a wafer stack may include N wafers. Among the N wafers, a bonding manner between adjacent wafers may be same. Namely, there is only one type of bonding. For example, all adjacent wafers are bonded by a bonding layer of a single material, or by hybrid bonding. Bonding manners between adjacent wafers may include multiple types. For example, some adjacent wafers are bonded by a bonding layer of a single material, and other adjacent wafers are bonded by hybrid bonding.

Referring to FIG. 7, the front faces of the 1st wafer 100 and the 2nd wafer 200 may be bonded to form a bonding surface 210, and the bonding surface 210 may be formed by using an adhesive layer of a dielectric material. Since the first edge trimming has been performed on the 2nd wafer 200, the uneven portion of the 2nd wafer 200 is removed. Thereby, cracks are less possible at the bonding surface 210.

Figure 8:
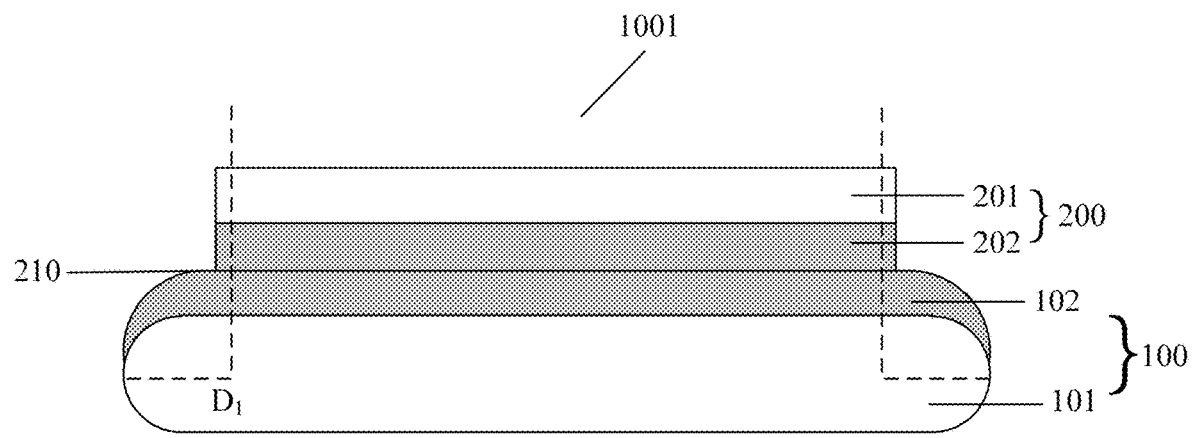
Figure 9:
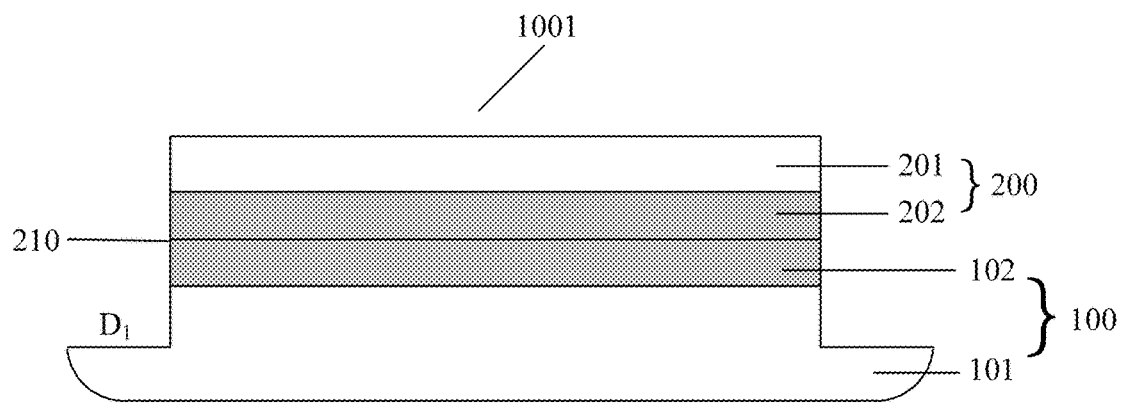
Figure 10:
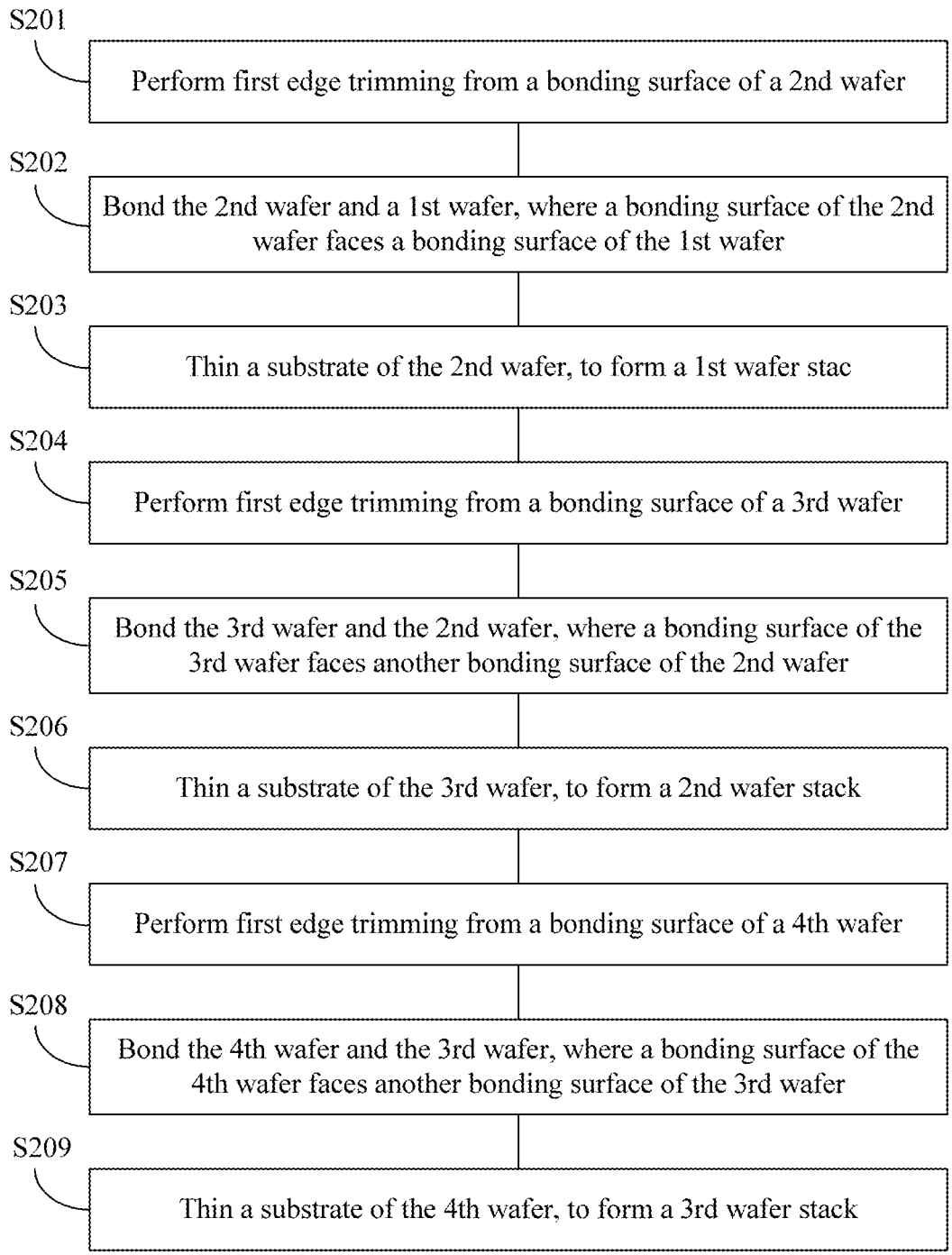
FIG. 10 is a schematic flow chart of a method for manufacturing a bonding structure according to an embodiment of the present disclosure.

In S103, the substrate of the n-th wafer substrate is thinned to form an (n−1)-th wafer stack, as shown in FIGS. 8 and 9.

After the n-th wafer and the (n−1)-th wafer are bonded, the substrate of the n-th wafer may be thinned to form the (n−1)-th wafer stack. A manner of the thinning includes a first thinning using chemical mechanical polishing and a second thinning using chemical etching. Since the first edge trimming has been performed on the n-th wafer, the substrate of the n-th wafer may be thinned to remove a wide portion of substrate that remains after the first edge trimming. Thereby, the n-th wafer has a uniform thickness in a direction perpendicular to the bonding surface. The substrate of the n-th wafer may further be thinned to remove more substrate material, and a specific thickness that is removed may be determined according to a practical situation.

For example, after the 1st wafer 100 and the 2nd wafer 200 are bonded, the substrate 201 of the 2nd wafer 200 may be thinned to form the 1st wafer stack 1001. The 1st wafer stack 1001 includes the 1st wafer 100 and the 2nd wafer 200, as shown in FIG. 8.

In a case that N is 2, namely, only 2 wafers are bonded, the bonding structure is formed at such time in this embodiment. In a case that N is greater than 2, it is necessary to continue bonding other wafers above the 1st wafer stack 1001.

After the substrate of the n-th wafer is thinned, second edge trimming may further be performed on the (n−1)-th wafer stack. A width of the second edge trimming is $D_{n-1}$. A part of the edge of the n-th wafer may be removed in the second edge trimming on the (n−1)-th wafer stack. Hence, $D_{n-1}$ may be larger than the width $W_n$ of the first edge trimming on the n-th wafer, namely, $D_{n-1} > W_n$. The second edge trimming extends into the substrate 101 of the 1st wafer 100 in depth. It is appreciated that in the second edge trimming on the (n−1)-th wafer stack, the edge of the n-th wafer may not be removed, and edges of the other wafers may be removed such that the edges of the other wafers are flush with the edge of the n-th wafer. Hence, $D_{n-1}$ may be equal to the width $W_n$ of the first edge trimming on the n-th wafer, namely, $D_{n-1}=W_n$.

It is taken as an example that n is 2, as referring to FIG. 8. The second edge trimming may be performed on the 1st wafer stack 1001 along the dash line. The width of the second edge trimming is $D_1$. The 1st wafer stack 1001 after the second edge trimming may refer to FIG. 9.

Through the second edge trimming on the (n−1)-th wafer stack, a portion that is damaged in thinning the n-th wafer can be removed at the edge of the n-th wafer and edges of other wafers. For example, the edge of the 1st wafer 100 and the edge of the 2nd wafer 200 may be damaged in thinning the substrate 201 of the 2nd wafer 200, resulting in that the edge of the 1st wafer 100 and the edge of the 2nd wafer 200 are uneven. Hence, the second edge trimming on the 1st wafer stack 1001 may remove the uneven edge of the 1st wafer 100 and the uneven edge of the 2nd wafer 200, thereby improving the bonding strength of the 1st wafer stack 1001.

Namely, an entire width of an edge trimmed from the (n−1)-th wafer stack is $D_{n-1}$ after the second edge trimming on the (n−1)-th wafer stack. In a case that an (n+1)-th wafer is bonded to the n-th wafer, the width of the first edge trimming on the (n+1)-th wafer may be greater than or equal to the entire width $D_{n-1}$ of an edge trimmed from the (n−1)-th wafer stack. Namely, a width of the (n+1)-th wafer is less than or equal to a width of the (n−1)-th wafer stack, facilitating improving a bonding strength of an n-th wafer stack that is subsequently formed.

In the bonding structure and the method for manufacturing the bonding structure according to the embodiment of the present disclosure, the first edge trimming can be performed from the bonding surface of the n-th wafer in bonding the n-th wafer and the (n−1)th wafer, and the width of the first edge trimming is $W_n$. As n increases, the width of the first edge trimming can be gradually increased. A reason is that an edge of a wafer is generally not even enough, resulting in a gap in bonding the wafers. After trimming the edge of the wafer, a portion that is not even at the edge of the n-th wafer can be removed. The bonding surface of the n-th wafer faces the bonding surface of the (n−1)-th wafer, so as to bond the n-th wafer and the (n−1)-th wafer. There is a reduced possibility that a gap exists between the bonding interfaces of the wafers, and a bonding strength between the wafers is improved. Afterwards the substrate of the n-th wafer is thinned, so as to form the (n−1)-th wafer stack. Since the bonding between adjacent wafers is strong, the formed wafer stack has a high reliability and a low risk of cracking.

Hereinafter cases of n being 2, 3, and 4 for forming a 1st wafer stack 1001, a 2nd wafer stack 1002, and a 3rd wafer stack 1003 are introduced in conjunction with a flowchart in FIG. 10 and FIGS. 11 to 18. Reference is made FIG. 10, which is a schematic flowchart of a method for manufacturing a bonding structure according to an embodiment of the present disclosure. The method including steps S201 to S209.

In S201, first edge trimming is performed from a bonding surface of a 2nd wafer 200, as shown in FIG. 3.

The 2nd wafer 200 may include a substrate 201 and a device structure 202 on the substrate 201. The first edge trimming may be performed from the bonding surface of the 2nd wafer 200, before the 2nd wafer 200 and the 1st wafer 100 are bonded. The first edge trimming on the 2nd wafer 200 may extend into the substrate 201 of the 2nd wafer 200 in depth. The width of the first edge trimming is $W_2$. The $W_2$ may be larger than a size of a curved portion at an edge of the 2nd wafer 200. Referring to FIG. 3, an uneven portion of the 2nd wafer 200 is removed after the first edge trimming on the 2nd wafer 200. Thereby, there is a reduced possibility that a gap exists at a bonding surface of a wafer stack that is subsequently formed.

A manner of the first edge trimming on the 2nd wafer 200 may be determined according to a practical situation. Referring to FIG. 6, the trimming may be performed along the dash line in the figure, so as to remove the uneven portion at the edge of the 2nd wafer 200. In this embodiment, the edge trimming may be performed along a straight line or along a curve. It is appreciated that the trimming on the wafer should avoid a device structure of the wafer and should not damage the device structure.

In S202, the 2nd wafer 200 and the 1st wafer 100 are bonded, where the bonding surface of the 2nd wafer 200 faces a bonding surface of the 1st wafer 100, as shown in FIG. 7.

A material layer for bonding may be formed on the bonding surface of the 2nd wafer 200. The bonding material layer may be an adhesive layer of a dielectric material, such as silicon oxide or silicon nitride, according to different designs and different bonding manners. Thereby, the two wafers are bonded by a molecular force provided by the adhesive layer. The bonding may also be performed by means of hybrid bonding. The adhesive layer of the dielectric material and a metal bonding marking are formed on the front surfaces of both two wafers, and the hybrid bonding between the two wafers is implemented after aligning the bonding markings.

Referring to FIG. 7, the front faces of the 1st wafer 100 and the 2nd wafer 200 may be bonded to form a bonding surface 210, and the bonding surface 210 may be formed by using an adhesive layer of a dielectric material. Since the first edge trimming has been performed on the 2nd wafer 200, the uneven portion of the 2nd wafer 200 is removed. Thereby, cracks are less possible at the bonding surface 210.

In S203, the substrate 201 of the 2nd wafer 200 is thinned to form a 1st wafer stack 1001, as shown in FIGS. 8 and 9.

After the 1st wafer 100 and the 2nd wafer 200 are bonded, the substrate 201 of the 2nd wafer 200 may be thinned to form the 1st wafer stack 1001. The 1st wafer stack 1001 includes the 1st wafer 100 and the 2nd wafer 200, as shown in FIG. 8. A manner of the thinning includes a first thinning using chemical mechanical polishing and a second thinning using chemical etching.

Since the first edge trimming has been performed on the 2nd wafer 200, the substrate 201 of the 2nd wafer may be thinned to remove a wide portion of substrate 201 that remains after the first edge trimming. Thereby, the 2nd wafer has a uniform thickness in a direction perpendicular to the bonding surface 210. It is appreciated that the substrate 201 of the 2nd wafer may further be thinned to remove more substrate material, and a specific thickness that is removed may be determined according to a practical situation.

After the substrate 201 of the 2nd wafer is thinned, the 1st wafer and the 2nd wafer are different in size, and hence second edge trimming may further be performed on the 1st wafer stack 1001. A width of the second edge trimming is $D_1$. A part of the edge of the 2nd wafer may be removed in the second edge trimming on the 1st wafer stack 1001. Hence, $D_1$ may be larger than or equal to the width $W_2$ of the first edge trimming on the 2nd wafer 200, namely, $D_1 \geq W_2$. The second edge trimming extends into the substrate 101 of the 1st wafer 100 in depth, as referring to FIG. 8. The second edge trimming may be performed on the 1st wafer stack 1001 along the dash line. The 1st wafer stack 1001 after the second edge trimming may refer to FIG. 9.

Figure 11:
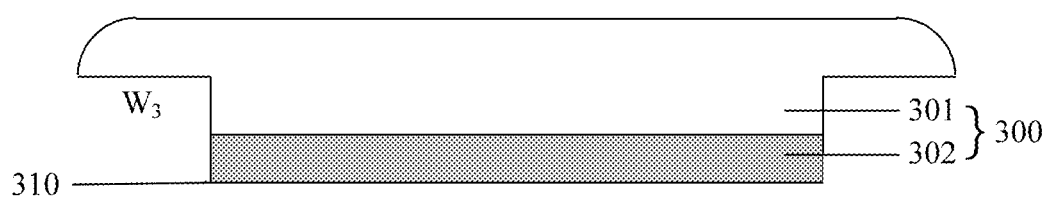
FIGS. 11 to 18 are schematic diagrams of wafers in a process of manufacturing a bonding structure according to an embodiment of the present disclosure.

In S204, first edge trimming is performed from a bonding surface of a 3rd wafer 300, as shown in FIG. 11.

The 3rd wafer 300 may include a substrate 301 and a device structure 302 on the substrate 301. The first edge trimming may be performed from the bonding surface of the 3rd wafer 300, before the 3nd wafer 300 and the 2nd wafer 200 are bonded. The first edge trimming on the 3rd wafer 300 may extend into the substrate 301 of the 3rd wafer 300 in depth. The width of the first edge trimming is $W_3$. The $W_3$ may be larger than a size of a curved portion at an edge of the 3rd wafer 300. Referring to FIG. 11, an uneven portion of the 3rd wafer 300 is removed after the first edge trimming on the 3rd wafer 300. Thereby, there is a reduced possibility that a gap exists at a bonding surface of a wafer stack that is subsequently formed.

A manner of the first edge trimming on the 3rd wafer 300 may refer to the manner of the first edge trimming on the 2nd wafer 200. Generally, the manner of the first edge trimming on the 3rd wafer 300 may be same as the manner of the first edge trimming on the 2nd wafer 200.

In this embodiment, the width of the first edge trimming on the 3rd wafer 300 may be greater than the width of the first edge trimming on the 2nd wafer 200, namely, $W_3 > W_2$. The width of the first edge trimming on the 3rd wafer 300 may be greater than the width of the second edge trimming on the 1st wafer stack 1001, namely, $W_3 > D_1$. Thereby, there is $W_3 > D_1 \geq W_2$.

Figure 12:
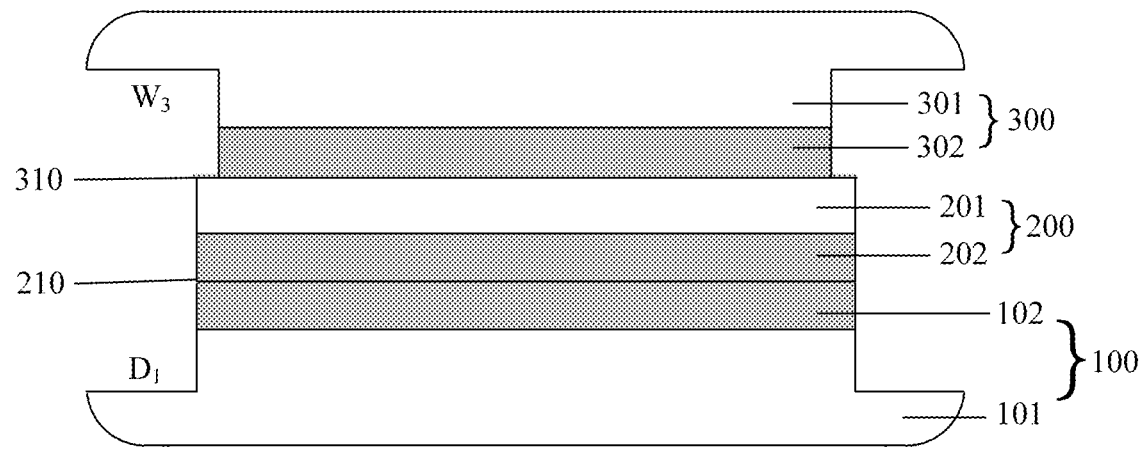

In S205, the 3rd wafer 300 and the 2nd wafer 200 are bonded, where the bonding surface of the 3rd wafer 300 faces another bonding surface of the 2nd wafer 200, as shown in FIG. 12.

A material layer for bonding may be formed on the bonding surface of the 3rd wafer 300. The bonding material layer may be an adhesive layer of a dielectric material, such as silicon oxide or silicon nitride, according to different designs and different bonding manners. Thereby, the two wafers are bonded by a molecular force provided by the adhesive layer. The bonding may also be performed by means of hybrid bonding. The adhesive layer of the dielectric material and a metal bonding marking are formed on the front surfaces of both two wafers, and the hybrid bonding between the two wafers is implemented after aligning the bonding markings.

Referring to FIG. 12, the front faces of the 2nd wafer 200 and the 3rd wafer 300 may be bonded to form a bonding surface 310, and the bonding surface 310 may be formed by using an adhesive layer of a dielectric material. Since the first edge trimming has been performed on the 3rd wafer 300, the uneven portion of the 3rd wafer 300 is removed. Thereby, cracks are less possible at the bonding surface 310.

Figure 13:
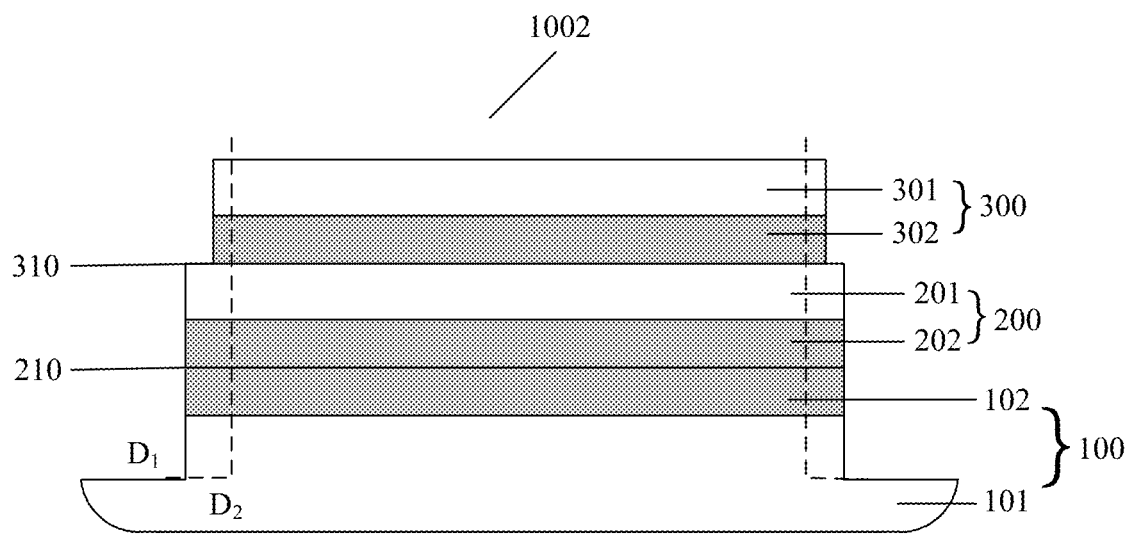
Figure 14:
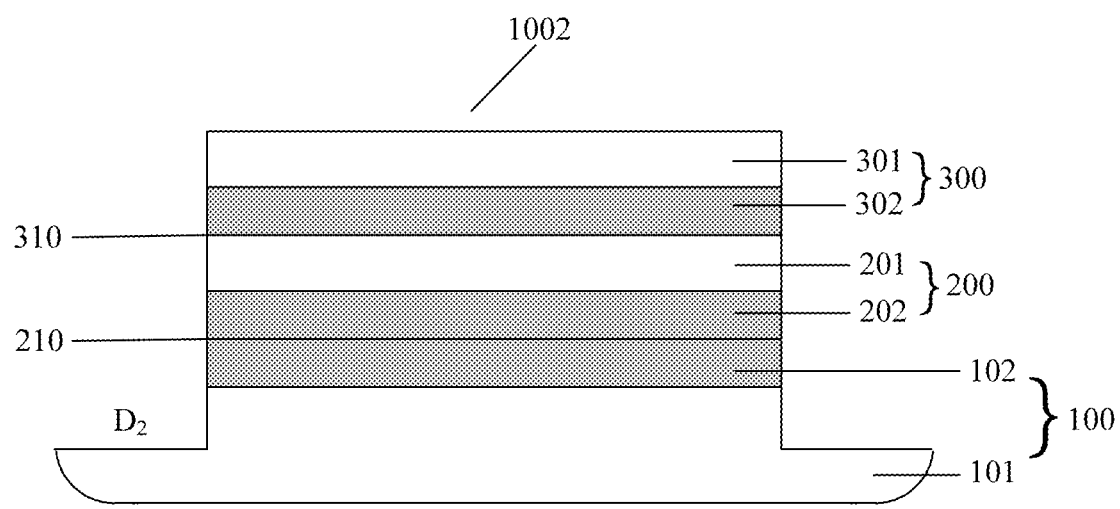

In S206, the substrate 301 of the 3rd wafer 300 is thinned to form a 2nd wafer stack 1002, as shown in FIGS. 13 and 14.

After the 2nd wafer 200 and the 3rd wafer 300 are bonded, the substrate 301 of the 3rd wafer 300 may be thinned to form the 2nd wafer stack 1002. The 2nd wafer stack 1002 includes the first wafer 100, the 2nd wafer 200 and the 3rd wafer 300, as shown in FIG. 13. A manner of the thinning includes a first thinning using chemical mechanical polishing and a second thinning using chemical etching.

Since the first edge trimming has been performed on the 3rd wafer 300, the substrate 301 of the 3rd wafer may be thinned to remove a wide portion of substrate 301 that remains after the first edge trimming. Thereby, the 3rd wafer has a uniform thickness in a direction perpendicular to the bonding surface 310. It is appreciated that the substrate 301 of the 3rd wafer may further be thinned to remove more substrate material, and a specific thickness that is removed may be determined according to a practical situation.

After the substrate 301 of the 3rd wafer is thinned, the 3rd wafer and the 1st wafer stack 1001 are different in size, and hence second edge trimming may further be performed on the 2nd wafer stack 1002. A width of the second edge trimming is $D_2$. A part of the edge of the 3rd wafer may be removed in the second edge trimming on the 2nd wafer stack 1002. Hence, $D_2$ may be larger than or equal to the width $W_3$ of the first edge trimming on the 3rd wafer 300, namely, $D_2 \geq W_3$. The second edge trimming extends into the substrate 101 of the 1st wafer 100 in depth, as referring to FIG. 13. The second edge trimming may be performed on the 2nd wafer stack 1002 along the dash line. The 2nd wafer stack 1002 after the second edge trimming may refer to FIG. 14.

Figure 15:
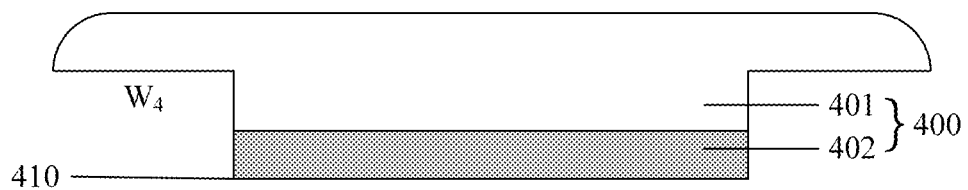

In S207, first edge trimming is performed from a bonding surface of a 4th wafer 400, as shown in FIG. 15.

The 4th wafer 400 may include a substrate 401 and a device structure 402 on the substrate 401. The first edge trimming may be performed from the bonding surface of the 4th wafer 400, before the 4th wafer 400 and the 3rd wafer 300 are bonded. The first edge trimming on the 4th wafer 400 may extend into the substrate 401 of the 4th wafer 400 in depth. The width of the first edge trimming is $W_4$. The $W_4$ may be larger than a size of a curved portion at an edge of the 4th wafer 400. Referring to FIG. 15, an uneven portion of the 4th wafer 400 is removed after the first edge trimming on the 4th wafer 400. Thereby, there is a reduced possibility that a gap exists at a bonding surface of a wafer stack that is subsequently formed.

A manner of the first edge trimming one the 4th wafer 400 may refer to the manner of the first edge trimming on the 2nd wafer 200. Generally, the manner of the first edge trimming on the 4th wafer 400 may be same as the manner of the first edge trimming on the 2nd wafer 200.

In this embodiment, the width of the first edge trimming on the 4th wafer 400 may be greater than the width of the first edge trimming on the 3rd wafer 300, namely, $W_4 > W_3$. The width of the first edge trimming on the 4th wafer 400 may be greater than the width of the second edge trimming on the 2nd wafer stack 1002, namely, $W_4 > D_2$. Thereby, there is $W_4 > D_2 \geq W_3$.

Figure 16:
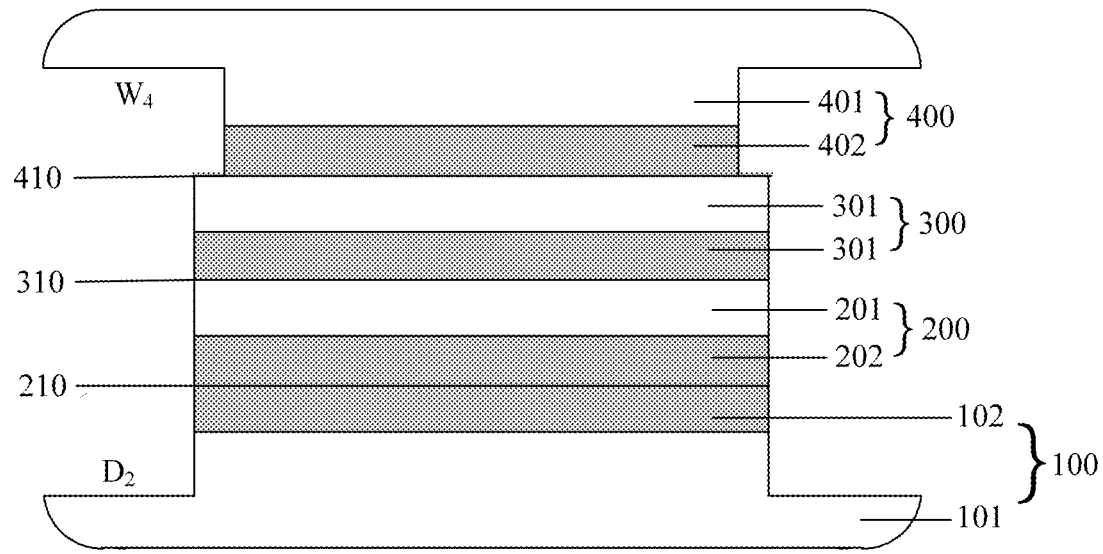

In S208, the 4th wafer 400 and the 3rd wafer 300 are bonded, where the bonding surface of the 4th wafer 400 faces another bonding surface of the 3rd wafer 300, as shown in FIG. 16.

A material layer for bonding may be formed on the bonding surface of the 4th wafer 400. The bonding material layer may be an adhesive layer of a dielectric material, such as silicon oxide or silicon nitride, according to different designs and different bonding manners. Thereby, the two wafers are bonded by a molecular force provided by the adhesive layer. The bonding may also be performed by means of hybrid bonding. The adhesive layer of the dielectric material and a metal bonding marking are formed on the front surfaces of both two wafers, and the hybrid bonding between the two wafers is implemented after aligning the bonding markings.

Referring to FIG. 16, the front faces of the 3rd wafer 300 and the 4th wafer 400 may be bonded to form a bonding surface 410, and the bonding surface 410 may be formed by using an adhesive layer of a dielectric material. Since the first edge trimming has been performed on the 4th wafer 400, the uneven portion of the 4th wafer 400 is removed. Thereby, cracks are less possible at the bonding surface 410.

Figure 17:
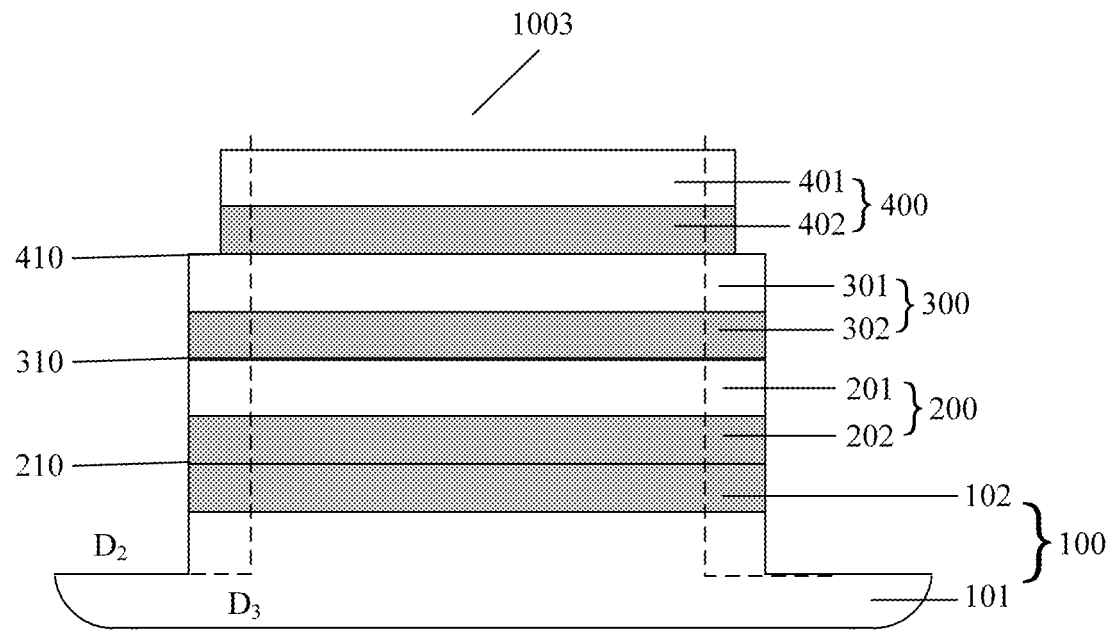
Figure 18:
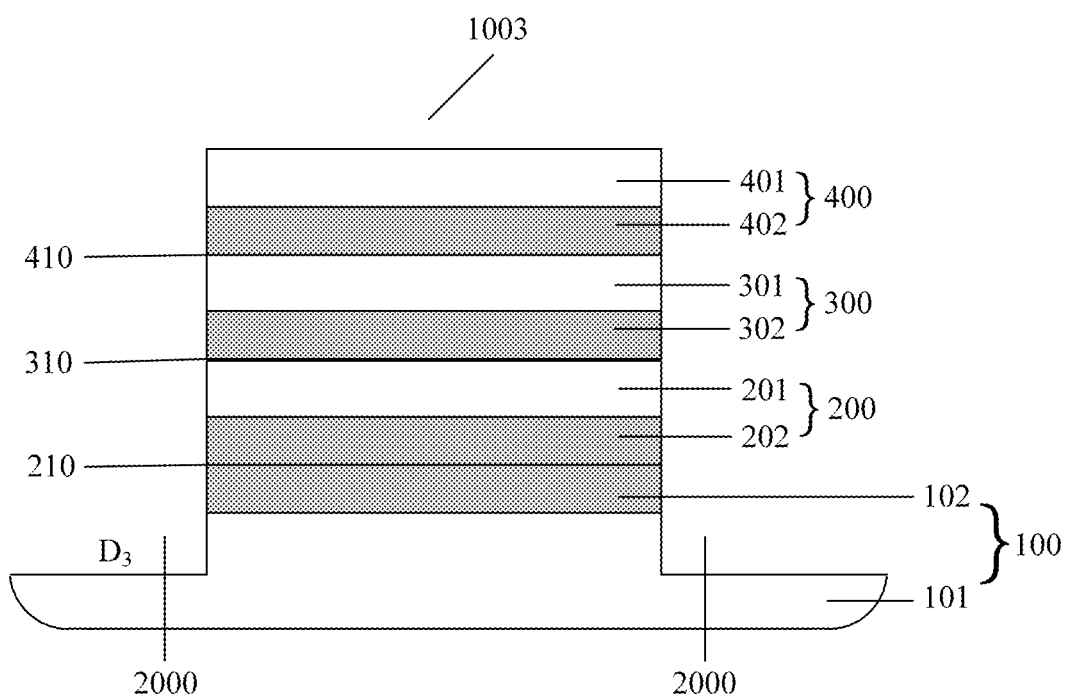

In S209, the substrate 401 of the 4th wafer 400 is thinned to form a 3rd wafer stack 1003, as shown in FIGS. 17 and 18.

After the 3rd wafer 300 and the 4th wafer 400 are bonded, the substrate 401 of the 4th wafer 400 may be thinned to form the 3rd wafer stack 1003. The 3rd wafer stack 1003 includes the 1st wafer 100, the 2nd wafer 200, the 3rd wafer 300, and the 4th wafer 400, as shown in FIG. 17. A manner of the thinning includes a first thinning using chemical mechanical polishing and a second thinning using chemical etching.

Since the first edge trimming has been performed on the 4th wafer 400, the substrate 401 of the 4th wafer may be thinned to remove a wide portion of substrate 401 that remains after the first edge trimming. Thereby, the 4th wafer has a uniform thickness in a direction perpendicular to the bonding surface 410.

After the substrate 401 of the 4th wafer is thinned, the 4th wafer and the 2nd wafer stack are different in size, and hence second edge trimming may further be performed on the 3rd wafer stack 1003. A width of the second edge trimming is $D_3$. A part of the edge of the 4th wafer may be removed in the second edge trimming on the 3rd wafer stack 1003. Hence, $D_3$ may be larger than or equal to the width $W_4$ of the first edge trimming on the 4th wafer 400, namely, $D_3 \geq W_4$. The second edge trimming extends into the substrate 101 of the 1st wafer 100 in depth, as referring to FIG. 16. The second edge trimming may be performed on the 3rd wafer stack 1003 along the dash line. The 3rd wafer stack 1003 after the second edge trimming may refer to FIG. 17.

In this embodiment, the 3rd wafer stack 1003 including the 1st wafer 100, the 2nd wafer 200, the 3rd wafer 300, and the 4th wafer 400 is formed. In practice, more wafers may be bonded, namely, N may be a larger positive integer. Thereby, a wafer stack is formed by bonding the more wafers. A method for bonding N wafers may refer to the above description for N of other values, and is described in detail herein. Accordingly, the bonding structure is formed according to the embodiment of the present disclosure. The edge trimming is performed after each bonding, such that a notch 2000 is formed at the edge of a final bonding structure, as shown in FIG. 18.

In the bonding structure and the method for manufacturing the bonding structure according to the embodiment of the present disclosure, the first edge trimming can be performed from the bonding surface of the n-th wafer in bonding the n-th wafer and the (n−1)th wafer, and the width of the first edge trimming is $W_n$. As n increases, the width of the first edge trimming can be gradually increased. A reason is that an edge of a wafer is generally not even enough, resulting in a gap in bonding the wafers. After trimming the edge of the wafer, a portion that is not even at the edge of the n-th wafer can be removed. The bonding surface of the n-th wafer faces the bonding surface of the (n−1)-th wafer, so as to bond the n-th wafer and the (n−1)-th wafer. There is a reduced possibility that a gap exists between the bonding interfaces of the wafers, and a bonding strength between the wafers is improved. Afterwards the substrate of the n-th wafer is thinned, so as to form the (n−1)-th wafer stack. Since the bonding between adjacent wafers is strong, the formed wafer stack has a high reliability and a low risk of cracking.

Based on the method for manufacturing a bonding structure according to the aforementioned embodiment, a bonding structure is further provided according to an embodiment of the present disclosure. Reference is made to FIG. 18, which is a schematic diagram of a bonding structure according to an embodiment of the present disclosure.

The bonding structure includes: a wafer stack 1003 formed by bonding the 1st wafer 100 to the N-th wafer (400, in case of N=4) sequentially. There is a notch 2000 at an edge of the wafer stack 1003. The notch 2000 extends from a surface of the Nth wafer (400, in case of N=4) into a substrate 101 of the 1st wafer. N is a natural number greater than 1.

Optionally, a quantity of types of bonding between adjacent wafers in the wafer stack is more than one.

Optionally, a quantity of a type of bonding between adjacent wafers in the wafer stack is one.

Optionally, the type of bonding includes: bonding with a bonding layer of a single material, or hybrid bonding.

The embodiments of the present disclosure are described in a progressive manner, and each embodiment places emphasis on the difference from other embodiments. Therefore, one embodiment can refer to other embodiments for the same or similar parts. Since bonding structure disclosed in the embodiments correspond to the method disclosed in the embodiments, the description of the bonding structure is simple, and reference may be made to the relevant part of the methods.

The foregoing embodiments are only preferred embodiments of the present disclosure. The preferred embodiments according to the disclosure are disclosed above, and are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure. All simple modifications, equivalent variations and improvements made based on the technical essence of the present disclosure without departing the content of the technical solutions of the present disclosure fall within the protection scope of the technical solutions of the present disclosure.

The invention claimed is:

1. A method for manufacturing a bonding structure, comprising:
   bonding N wafers sequentially,
   wherein for each integer n ranging from 2 to N, bonding an n-th wafer and an (n−1)-th wafer comprises:
   performing first edge trimming from a bonding surface of the n-th wafer, wherein a width of the first edge trimming is $W_n$, and the first edge trimming extends into a substrate of the n-th wafer in depth;
   bonding the n-th wafer and the (n−1)-th wafer, wherein the bonding surface of the n-th wafer faces the (n−1)-th wafer; and
   thinning the substrate of the n-th wafer, to form an (n−1)-th wafer stack;
   wherein N is a natural number greater than 1;
   wherein $W_n$ is greater than $W_{n-1}$ when n≥3; and
   wherein after thinning the substrate of the n-th wafer, bonding the n-th wafer and the (n−1)-th wafer further comprises:
   performing second edge trimming on the (n−1)-th wafer stack;
   wherein a width of the second edge trimming is $D_{n-1}$, and the second edge trimming extends into the substrate of a first wafer in depth; and wherein $D_{n-1}$ is greater than $W_n$ and small than $W_{n+1}$ when $2 \leq n < N$.

2. The method according to claim 1, wherein a quantity of types of bonding between adjacent ones among the N wafers is more than one.

3. The method according to claim 1, wherein a quantity of a type of bonding between adjacent ones among the N wafers is one.

4. The manufacturing method according to claim 2, wherein the types of bonding comprises at least one of:
   bonding with a bonding layer of a single material, or
   hybrid bonding.

5. The manufacturing method according to claim 3, wherein the type of bonding comprises:
   bonding with a bonding layer of a single material, or
   hybrid bonding.

6. The method according to claim 1, wherein thinning the substrate of the n-th wafer comprises:
   performing first thinning by using chemical mechanical polishing, and
   performing second thinning by using chemical etching after the first thinning.

* * * * *